(12) United States Patent
Sampigethaya et al.

(10) Patent No.: US 8,630,134 B2
(45) Date of Patent: *Jan. 14, 2014

(54) MEMORY CELLS HAVING A ROW-BASED READ AND/OR WRITE SUPPORT CIRCUITRY

(75) Inventors: Shreekanth Sampigethaya, San Jose, CA (US); Bharath Upputuri, Santa Clara, CA (US)

(73) Assignee: Taiwan Semiconductor Manufacturing Company, Ltd. (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/489,055

(22) Filed: Jun. 5, 2012

(65) Prior Publication Data

US 2012/0243347 A1    Sep. 27, 2012

Related U.S. Application Data

(63) Continuation of application No. 12/888,860, filed on Sep. 23, 2010, now Pat. No. 8,213,242.

(51) Int. Cl.
    *G11C 7/02* (2006.01)

(52) U.S. Cl.
    USPC .............................. 365/189.15; 365/230.03

(58) Field of Classification Search
    USPC ........................................ 365/189.15, 230.03
    See application file for complete search history.

(56) References Cited

U.S. PATENT DOCUMENTS

| 6,947,315 B2* | 9/2005 | Iwata ............................. 365/158 |
| 7,054,186 B2 | 5/2006 | Iwata |
| 2004/0125648 A1* | 7/2004 | Iwata ............................. 365/158 |
| 2004/0132232 A1 | 7/2004 | Noble |
| 2006/0039194 A1 | 2/2006 | Hidaka |
| 2007/0133326 A1* | 6/2007 | Ishikura et al. ................. 365/201 |
| 2009/0086536 A1* | 4/2009 | Kitagawa et al. ............. 365/180 |
| 2009/0103390 A1 | 4/2009 | Kim et al. |
| 2009/0196115 A1* | 8/2009 | Agari et al. ..................... 365/226 |
| 2009/0201745 A1* | 8/2009 | Ishikura et al. ........... 365/189.05 |
| 2009/0237988 A1* | 9/2009 | Kurose et al. .................. 365/171 |
| 2010/0052727 A1* | 3/2010 | Sugamoto et al. ............. 324/765 |
| 2010/0165735 A1* | 7/2010 | Hashimoto .............. 365/185.18 |

* cited by examiner

*Primary Examiner* — Michael Tran (74) *Attorney, Agent, or Firm* — Lowe Hauptman & Ham, LLP (57) ABSTRACT

A method of controlling a plurality of memory cells in a row. The method includes controlling a switching element using at least one write word line signal to raise a voltage of a node connected to the plurality of memory cells in the row when the plurality of memory cells in the row operate in a first mode. The method further includes controlling at least one transistor using the at least one write word line signal to connect the plurality of memory cells in the row to a reference voltage when the plurality of memory cells in the row operate in a second mode.

19 Claims, 5 Drawing Sheets

MEMORY CELLS HAVING A ROW-BASED READ AND/OR WRITE SUPPORT CIRCUITRY

CROSS-REFERENCE TO RELATED APPLICATIONS

This application is a Continuation of U.S. patent application Ser. No. 12/888,860, filed Sep. 23, 2010, entitled "Memory Cells Having a Row-Based Read and/or Write Support Circuitry", the application is hereby incorporated herein by reference in their entireties.

FIELD

The present disclosure is generally related to memory cells having a row-based read and/or write support circuitry.

BACKGROUND

Leakage current is commonly found in memories including, for example, static random access memories (SRAM), register files, etc. Generally, the higher the number of ports (e.g., read and/or write ports) for the memory, the higher the current leaks. Existing approaches have different methods to reduce the leakage current. For example, in some approaches the ground reference level (e.g., voltage VSS) is raised and/or the operational supply voltage (e.g., voltage VDD) is lowered, e.g., by a voltage dropped across a diode at the whole memory array level. In some approaches, when the memory is segmented, the whole segment has its voltage VSS and/or voltage VDD raised and/or lowered. Raising voltage VSS and/or lowering voltage VDD at the segment level or the memory array level affect the whole segment or memory array operation, including the power consumption and/or speed.

In some approaches, the bit line of the read port for the whole column of memory cells is floated during the retention period to reduce the leakage current. In these approaches, the whole accessed column is disabled during the time the bit line is floated, and before accessing the data, raising the bit line back to voltage VDD is required, which impacts the dynamic power because the VDD nodes for the whole segment/array are coupled together and have a large capacitance. As a result, the memory speed is compromised.

In some other approaches, high threshold voltage (HVT) bit cells are used, but the memory access time is then also increased.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. In some embodiments, the leakage current with respect to the read operation is reduced because the ground reference level in un-accessed rows is floated without affecting the content of the bit cell or changing the static noise margin (SNM) of the six-transistor (6T) portion of the bit cell. In some embodiments, the leakage current with respect to the write operation is also reduced because the ground reference of the 6T portion for un-accessed rows is raised. The leakage current reduction is substantial when the number of ports (e.g., read and/or write ports) increases. In some embodiments, the leakage current is saved on a per-row basis with respect to both a write operation and a read operation. For example, in some embodiments, in a read or a write operation, one row is accessed while leakage current in the un-accessed rows is reduced (e.g., in the write operation) or eliminated (e.g., in the read operation).

Exemplary Circuit

Figure 1:
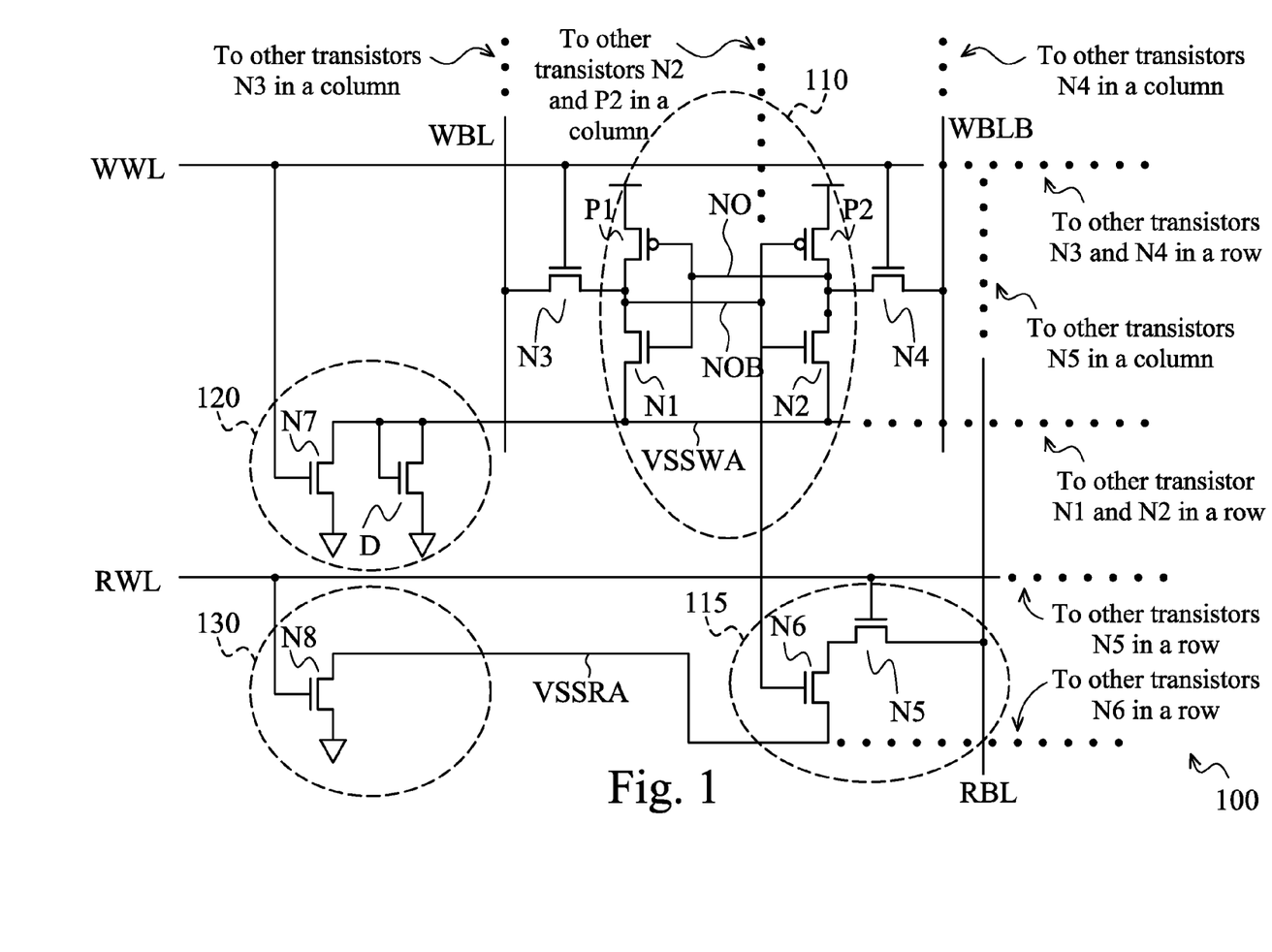
FIG. 1 is a diagram of an exemplary circuit, in accordance with some embodiments.

FIG. 1 is a diagram of an exemplary circuit 100 illustrating an operation of a memory cell (e.g., bit cell) 110, in accordance with some embodiments.

Memory cell 110 is commonly used in a memory array in, e.g., an SRAM, a register file, etc. The memory array is arranged in a plurality of rows and columns, which, for simplicity, is not shown. Depending on configurations, the number of memory cells in a row and in a column of the memory array varies, for example, 64, 128, 256, 512, etc., memory cells. For illustration, a memory array having a number of rows n (e.g., from row R-1 to row R-n) and a number of columns m (e.g., from column C-1 to column C-m) is used for explanation in this document, where n and m are any integer number.

Transistors P1, P2, N1, and N2 form a cross-latch for a memory cell 110. Alternatively explained, transistors P1 and N1 form a first inverter, e.g., inverter INV1 (not labeled) while transistors P2 and N2 form a second inverter, e.g., inverter INV2 (not labeled), and inverters INV1 and INV2 form the cross latch for memory cell 110. A node VSSWA couples the sources and the substrates of transistors N1 and N2 in a same row, and serves as a ground reference for transistors N1 and N2 or for memory cells 110 in the same row.

In some embodiments, when a write access occurs, the data is written to all memory cells in a row of the memory array. A write word line WWL controls all memory cells 110 in the same row. Write bit lines WBL and WBLB couple a plurality of memory cells 110 in a column. Write bit lines WBL and WBLB together with the corresponding pair of transistors N3 and N4 are commonly called a write port of a memory cell 110. In some embodiments, the data in a write cycle inserted at bit lines WBL and WBLB are written to the corresponding nodes NO and NOB of the corresponding memory cell 110 that are activated by the write word line WWL. Storage nodes NO and NOB store the data for a corresponding memory cell 110. In some embodiments, the data stored in nodes NO and NOB are complementary to each other. For example, if a node NO stores a Low then the corresponding node NOB stores a High, and if a node NO stores a High, then the corresponding node NOB stores a Low. In some embodiments, write bit lines WBL and WBLB are charged to a High (e.g., by a charging circuit, not shown) when the corresponding memory cell 110 is not in a write access mode.

Transistors N3 and N4 serve as a mechanism for transferring data between write bit lines WBL and WBLB and the respective nodes NO and NOB. For example, to write to a memory cell 110, the corresponding write word line WWL is activated (e.g., applied with a High) to turn on the corresponding transistors N7, N3, and N4. The data inserted at write bit lines WBL and WBLB are then transferred via the respective transistors N3 and N4 to the respective nodes NO and NOB. For example, when write word line WWL of row R-1 (labeled in FIG. 4) is activated, transistors N3 and N4 of memory cells 110 in row R-1 are activated and the data in all write bit lines WBL and WBLB in row R-1 are written to the corresponding nodes NO and NOB. Once the data for the memory cells 110 are written to nodes NO and NOB, the corresponding write word line WWL is de-activated (e.g., driven Low).

In some embodiments, a circuit (e.g., a write support circuit) 120 is used for all memory cells 110 in a row of the memory array. A node VSSWA is coupled to the sources of transistors N1 and N2 of all memory cells 110 in a same row and to the drain of transistor N7 and the drain of the transistor forming diode D in the corresponding circuit 120. A Node VSSWA is also coupled to the substrates of transistors N1 and N2. A circuit 120 serves as current paths and reduces the leakage current with respect to the write operation of memory cells 110 in the corresponding row. For example, when a row (e.g., row R-1) is accessed, other rows (e.g., row R-2 to row R-n) are un-accessed. In un-accessed row R-2 to row R-n, the word bit lines WWL are de-activated, and the corresponding transistors N7 are therefore turned off, which electrically disconnects the memory cells 110 from ground via transistors N7. At the same time, the corresponding diodes D serve as a current path for the corresponding memory cells 110. As a result, the corresponding nodes VSSWA in row R-2 to row R-n are raised by a voltage, e.g., voltage VtD, which is dropped across the corresponding diode D. Because the voltages at nodes VSSWA are raised, the leakage current in memory cells 110 is reduced. For example, when a node NO stores a High, transistor N2 is on, but transistor N1 is off, the voltage at node VSSA and thus at the substrate of transistor N1 is raised. Consequently, the voltage swing between the operational voltage of transistor N1 to the substrate is reduced, which reduces the leakage current. Circuit 120 is shown for illustration, other circuits that can provide the current paths and/or raise the voltage level at node VSSWA are within the scope of the various embodiments. For example, a transistor N7 can be replaced by a switch, a PMOS transistor having the gate controlled by an inverter inverting the read word line WWL, etc. Similarly, diodes D can be replaced by either NMOS or PMOS transistors having the gates controlled by respective regulators, reference voltages, or the like.

In some embodiments, when a read access occurs, the data from all memory cells in a row of the memory array is read. Further, a read word line RWL controls all circuits 115 in a row. A node VSSRA couples the sources of transistors N6 of circuits 115 in a row. A circuit 115 is commonly called a read circuit, and together with the corresponding read bit line RBL is commonly called a read port for a corresponding memory cell 110. To read data from a node, e.g., node NO of a memory cell 110, the data is detected at the corresponding read bit line RBL. For example, at the time of reading a memory cell 110 in a column, e.g., column C-1 (labeled in FIG. 4), the corresponding read word line RWL is activated to turn on transistors N5 and N8, and if the read bit line RBL of column R-1 is detected to be High, then the corresponding node NO stores a Low (and the corresponding node NOB stores a High). But if the read bit line RBL is detected to be Low, then the corresponding node NO stores a High (and the corresponding node NOB stores a Low). In some embodiments, a read bit line RBL is charged to a High (e.g., by a charge circuit, not shown), when the corresponding memory cell 110 is not in a read access mode.

In some embodiments, a circuit (e.g., a read support circuit) 130 is used for all memory cells 110 in a row of the memory array. A read word line RWL, which is coupled to the gate of transistor N8 of circuit 130, is coupled to the gate of transistor N5 in all memory cells 110 in the corresponding row. A circuit 130 serves as a current path and to float node VSSRA to reduce/eliminate leakage current with respect to the read operation of the memory cells 110 in the corresponding row. For example, in some embodiments, when a row (e.g., row R-1) is accessed, other rows (e.g., row R-2 to row R-n) are un-accessed. In un-accessed row R-2 to row R-n, the read word lines RWL are inactivated and thus turn off transistors N6. As a result, nodes VSSRA of row R-2 to row R-n are floating, and there is no leakage current from read bit lines RBL through transistors N5 and N6 in row R-2 to row R-n. Circuit 130 is shown for illustration, other circuits that can provide a current path and/or float node VSSRA are within the scope of the various embodiments. For example, the NMOS transistor N8 can be replaced by a switch or by a PMOS transistor controlled by an inversed read word line RWL (e.g., inverted read word line RWLI), etc.

Exemplary Writing Method

Figure 2:
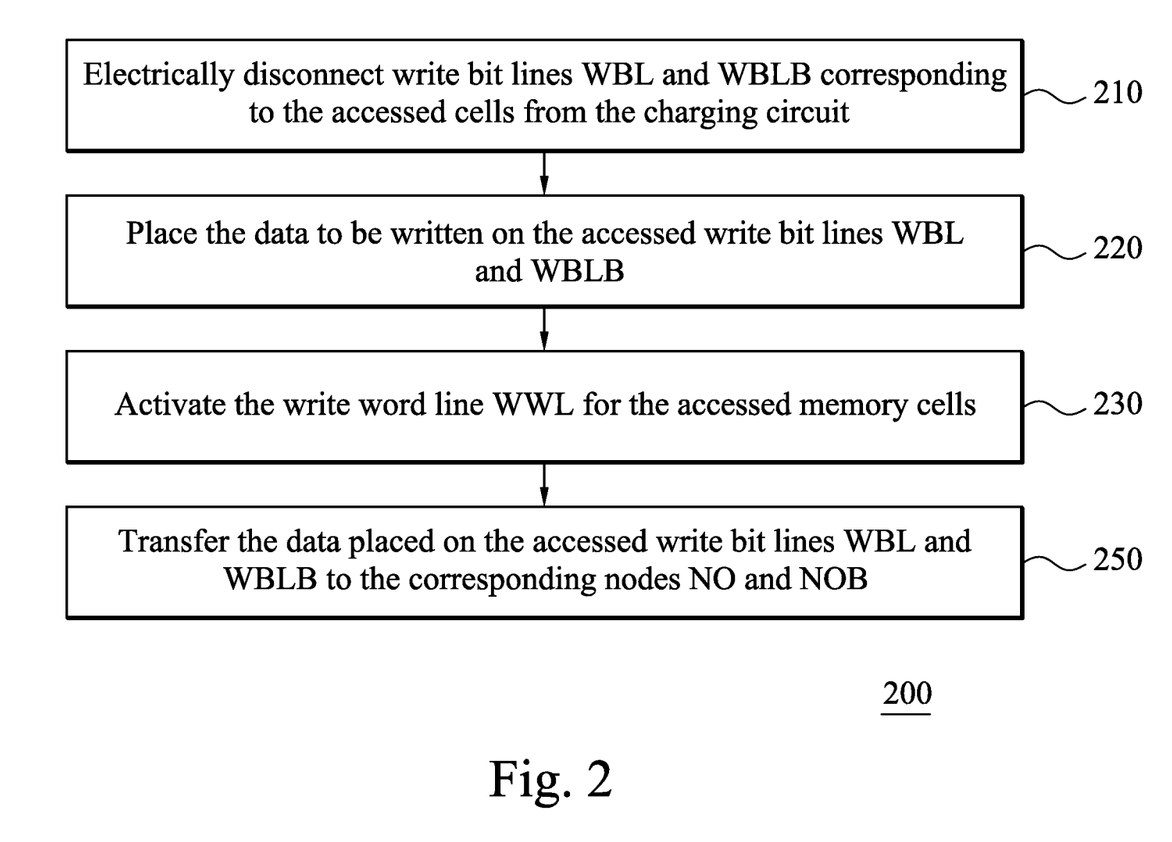
FIG. 2 is a flowchart illustrating a read operation of the circuit in FIG. 1, in accordance with some embodiments.

In some embodiments, writing data to a memory cell 110 results in writing data to a row of memory cells 110 in a memory array. FIG. 2 is a flowchart 200 illustrating a method of writing data to a row (e.g., row R-1) of memory cells 110, in accordance with some embodiments. In an array having n number of rows and m number of columns, row R-1 is called the write access row while row R-2 to row R-n are called the un-accessed rows.

In step 210, write bit lines WBL and WBLB corresponding to the memory cells 110 in accessed row R-1 (e.g., accessed write bit lines WBL and WBLB) are configured to be independent of (e.g., electrically disconnected from) the charging circuit.

In step 220, the data to be written to memory cells 110 in accessed row R-1 is placed at the corresponding accessed bit lines WBL and WBLB.

In step 230, the write word line WWL for accessed row R-1 (e.g., write word line WWL(1), not shown) is activated, which turns on transistors N3 and N4 in memory cells 110 of accessed row R-1. Write word line WWL(1) also turns on transistor N7 of circuit 120 corresponding to accessed row R-1 (e.g., transistor N7(1), not shown). As a result, transistor N7(1) serves as a current path for memory cells 110 in accessed row R-1.

In some embodiments, the write word line WWL for row R-2 to row R-n (e.g., write word line WWL(2) to WWL(n), not shown) are in a default condition of being deactivated, which turns off transistors N3 and N4 in memory cells 110 in un-accessed row R-2 to row R-n. In effect, the deactivated write word lines WWL(2) to WWL(n) prevent memory cells 110 in un-accessed row R-2 to row R-n from being written to. Write word lines WWL(2) to WWL(n) also turn off transistors N7 in un-accessed row R-2 to row R-n (e.g., transistors N7(2) to N7(n), not shown). As a result, diodes D in un-accessed row R-2 to row n (e.g., diodes D(2) to D(n), not shown) serve as current paths for memory cells 110 in un-accessed row R-2 to row R-n, which cause the voltage levels at nodes VSSWA in un-accessed row R-2 to row R-n (e.g., nodes VSSWA(2) to VSSWA(n), not shown) to be raised by voltage VtD. Consequently, the leakage current in memory cells 110 in un-accessed row R-2 to row R-n is reduced compared with the situations where nodes VSSWA(2) to VSSWA(n) are not raised.

In step 250, the data in write bit lines WBL and WBLB is transferred (e.g., written to) the corresponding nodes NO and NOB.

In the above illustration of flowchart 200, activating write word line WWL(1) and deactivating write word lines WWL(2) to WWL(n) can be done at the same time or at different times, e.g., one step is done prior to (or subsequent to) the other step. Various embodiments are not limited to a particular order.

Exemplary Reading Method

Figure 3:
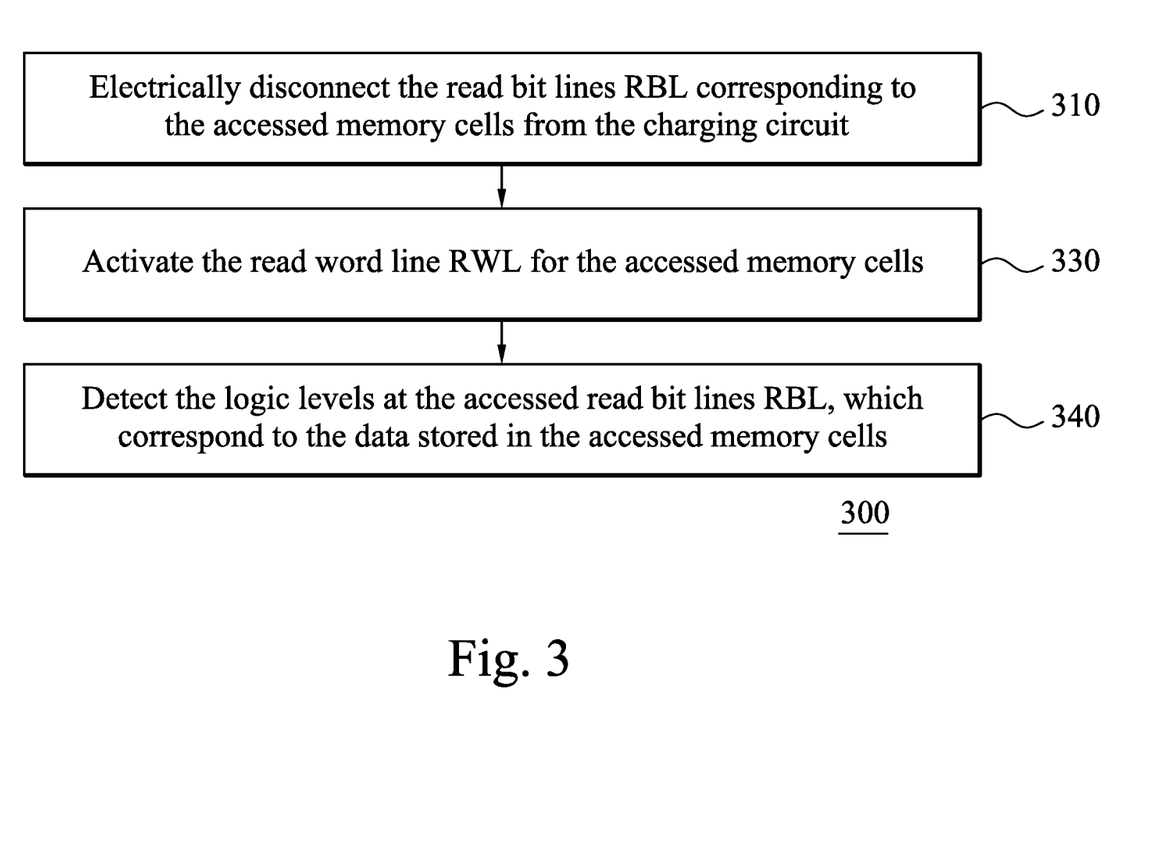
FIG. 3 is a flowchart illustrating a write operation of the circuit in FIG. 1, in accordance with some embodiments.

In some embodiments, reading data from a memory cell 110 results in reading data from memory cells 110 in a row of the memory array. FIG. 3 is a flowchart 300 illustrating a method of reading data from a row (e.g., row R-1) of memory cells 110, in accordance with some embodiments. In an array having n number of rows and m number of columns, row R-1 is called the read access row while row R-2 to row R-n are called the un-accessed rows.

In step 310, read bit lines RBL corresponding to the memory cells 110 in accessed row R-1 are configured to be independent of (e.g., electrically disconnected from) the charging circuit. They, however, remain High at the charged voltage level.

In some embodiments, the read word line RWL corresponding to un-accessed row R-2 to row R-n (e.g., read word lines RWL(2) to RWL(n), not shown) are in a default condition of being deactivated, which turns off transistors N5 in un-accessed row R-2 to row R-n. In effect, deactivated read word lines RWL(2) to RWL(n) prevent data from memory cells 110 in un-accessed row R-2 to row R-n from being read. Deactivated read word lines RWL(2) to RWL(n) also turn off transistor N8 of un-accessed row R-2 to row R-n (e.g., transistors N8(2) to N8(n), not shown). As a result, nodes VSSRA of un-accessed row R-2 to row R-n (e.g., nodes VSSRA(2) to VSSRA(n), not shown) are floating. Because nodes VSSRA(2) to VSSRA(n) are floating, there is no current path through transistors N6 in un-accessed row R-2 to row R-n. Stated differently, any leakage current with respect to the read operation in row R-2 to row R-n is reduced/eliminated.

In step 330, read word line RWL corresponding to accessed row R-1 (e.g., read word line RWL(1), not shown) is activated to turn on transistors N5 of memory cells 110 in accessed row R-1 (e.g., transistors N5(1) in row R-1, not shown). Read word line RWL(1) also turns on transistor N8 of circuit 130 corresponding to accessed row R-1 (e.g., transistor N8(1), not shown). Transistor N8(1) thus serves as a current path for transistors N5 and N6 of accessed row R-1.

In the above steps, the data at the nodes NO of memory cells 110 in a particular column in row R-1 provides the data appeared at the corresponding read bit line RBL. For example, if node NO of a memory cell 110 in row R-1 and column C-1 (e.g., node NO(1,1), not shown) stores a Low, then transistor N6 of row R-1 and column C-1 (e.g., transistor N6(1,1), not shown) is off. As a result, read bit line RBL(1) continues to be High, which corresponds to the Low data of node NO(1,1) or the High data at node NOB(1,1). If, however, node NO(1,1) stores a High, which turns on transistor N6(1,1). Because read word line RWL(1) is activated, transistor N5 of row R-1 and column C-1 (e.g., transistor N5(1,1)) is on. Because transistor N5(1,1) and transistor N6(1,1) are on, read bit line RBL(1) is pulled to the voltage at the source of transistor N6(1,1) or at node VSSRA(1). In addition, because transistor N8(1) is on, node VSSRA(1), also being the drain of transistor N8(1), is pulled to the voltage level at the source of transistor N8(1), which is ground. In effect, read bit line RBL(1) is pulled to ground or Low, which corresponds to the High data stored in node NO(1,1) or the Low data in node NOB(1,1).

In step 340, the logic levels at the corresponding read bit lines RBL are detected, which reveals the data stored in the corresponding nodes NO and NOB.

Circuit 100 in FIG. 1 is commonly called a one read port, one write port (e.g., 1R1W) circuit. For example, circuit 115 comprising the pair of transistors N5 and N6 together with a read bit line RBL is called a read port. In contrast, a pair of NMOS transistors N3 and N4 together with the corresponding pair of write bit lines WBL and WBLB is called a write port. In some embodiments, a plurality of circuits 115 in a row is coupled to a circuit 130, which reduces/eliminates leakage current with respect to the read operation as explained above. In some embodiments, a write port is associated with a circuit 120 and a write word line WWL, which reduces leakage current with respect to the write operation as explained above. Various variations of circuit 100, e.g., one read port and multiple write ports, multiple read ports and one write port, multiple read ports and multiple write ports, etc., are within the scope of the various embodiments.

Embodiments with Circuit Variations for a Read Operation

Figure 4:
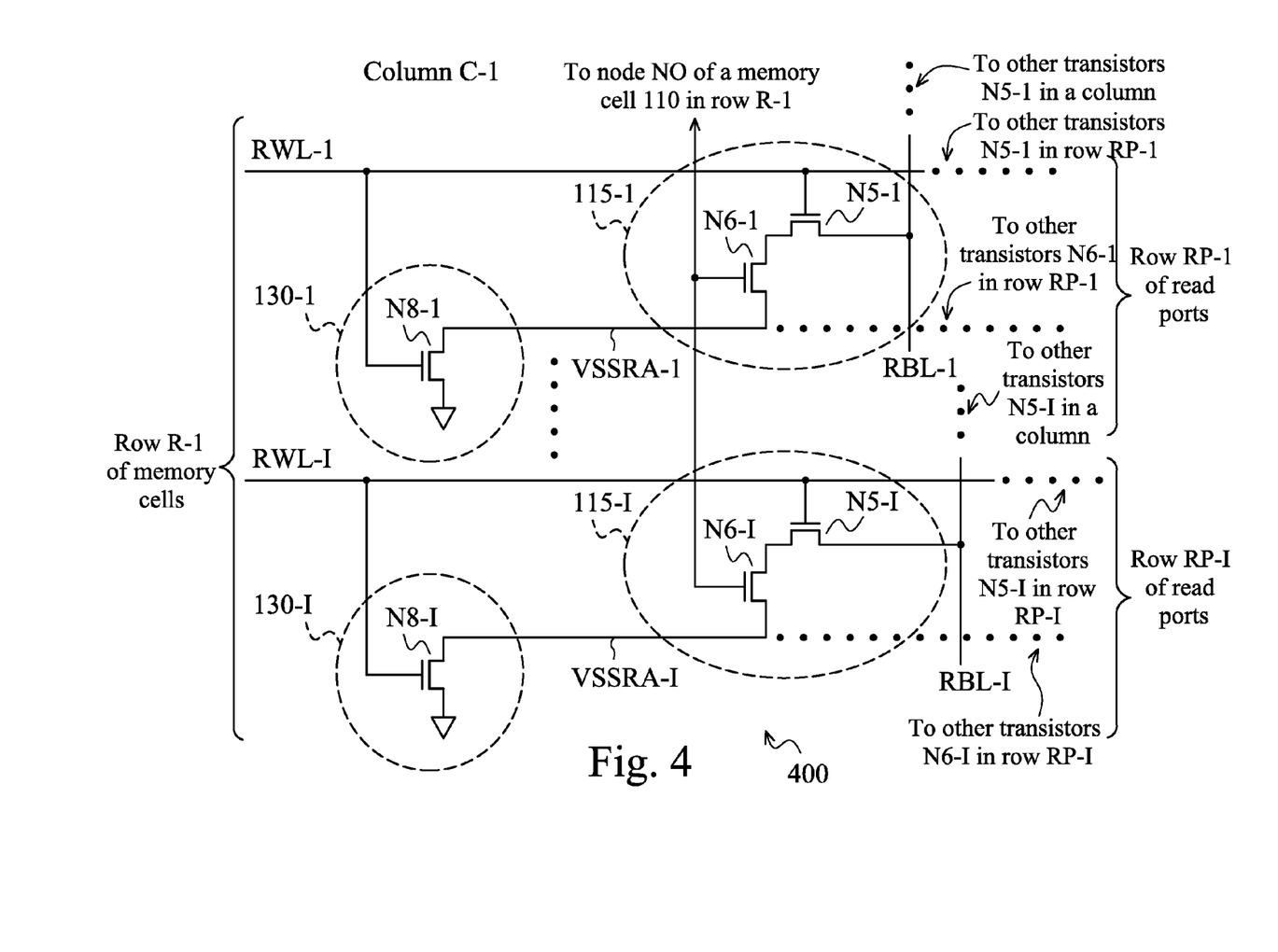
FIG. 4 is a diagram of a circuit illustrating the memory cell in FIG. 1 having I number of read ports, wherein I is a positive number, in accordance with some embodiments.

FIG. 4 shows a diagram of a circuit 400 including I number of read ports associated with a memory cell 110 in a row and a column (e.g., row R-1 and column C-1) of the memory array (e.g., memory cell 110-1-1, not shown), wherein I is a positive number, in accordance with some embodiments. For simplicity, memory cell 110-1-1 and circuitry associated with the write operation for memory cell 110-1-1 are not shown. Because circuit 400 includes I number of read ports per memory cell 110, circuit 400 includes I number of rows (e.g., row RP-1 to row RP-I of read ports), I number of read word lines RWL (e.g., read word lines RWL-1 to RWL-I), I number of circuits 130 (e.g., circuits 130-1 to 130-I), I number circuits 115 (e.g., circuits 115-1 to 115-I), and I number of read bit lines RBL (e.g., read bit lines RBL-1 to RBL-I).

A read word line RWL in FIG. 4 is associated with a row of read ports and is coupled to the gate of transistor N8 and the gates of transistors N5 of circuits 115 of the read ports in the same row. For example, read word line RWL-1 is associated with read ports in row RP-1 and is coupled to the gate of transistor N8-1 of circuit 130-1 and the gates of transistors N5-1 of circuits 115-1 in row RP-1. Read word line RWL-I is associated with row RP-I and is coupled to the gate of transistor N8-I of circuit 130-I and the gates of transistors N5-I of circuits 115-I in row RP-I, etc.

The drain of a transistor N8 of a circuit 130, which is also a node VSSRA, is coupled to the sources of transistors N6 of circuits 115 in a same row of read ports. For example, the drain of transistor N8-1 of circuit 130-1 corresponding to row RP-1 of read ports is coupled to the sources of transistors N6-1 of circuits 115-1 in row RP-1. The drain of transistor N8-I of circuit 130-I corresponding to row RP-I is coupled to the sources of transistors N6-I of circuit 115-I in row RP-I, etc.

In some embodiments, a memory cell 110 is associated with I number of read word lines RWL and I number of circuits 130, and thus I number nodes VSSRA (e.g., node VSSRA-1 to VSSRA-I). When a read port is not active in reading (e.g., a read port in row RP-1 that is not read accessed), the corresponding read word line (e.g., read word line RWL-1) turns off a corresponding transistor N8, e.g., transistor N8-1, which causes the corresponding node VSSRA, e.g., node VSSRA-1, to float, and as a result, the leakage current is reduced as explained above.

A memory cell 110 is also associated with I number of circuits 115 in a column wherein a circuit 115 is in a row of read ports. The gate of transistors N6 of circuits 115 in a same column is coupled together and is coupled to a node of a memory cell 110. For example, the gates of transistors N6-1 to N6-I of circuits 115-1 to 115-I corresponding to the row of read port RP-1 to RP-I are coupled together and coupled to a node (e.g., node NO) of a memory cell (e.g., memory cell 110-1-1).

Each drain of a transistor N5 in a circuit 115 in a row of read ports is coupled to a respective read bit line RBL. For example, the drain of transistor N5-1 of circuit 115-1 in row RP-1 is coupled to read bit line RBL-1, and the drain of transistor N5-I of circuit 115-I in row RP-I is coupled to read bit line RBL-I, etc. Detecting the logic level at one or a plurality of bit lines RBL reveals the data stored in the corresponding node NO and/or node NOB.

In FIG. 1, the gate of transistor N6 in circuit 115 is coupled to node NO of memory cell 110. In some other embodiments, the gate of transistor N6 in circuit 115 is coupled to node NOB, instead of node NO, and the read operation of node NOB is similar to the read operation of node NO. Similarly, in FIG. 4, circuits 115-1 to 115-I are coupled to node NO, but circuits 115-1 to 115-I can be coupled to node NOB instead of node NO. In some embodiments, a memory cell 110 is coupled to one or a plurality of circuits 115 (and associated circuits 130 and read word lines RWL) via a node NO, a node NOB, or both nodes NO and NOB. Stated differently, a memory cell 110 can have one or a plurality of read ports, wherein the one or the plurality of read ports can be associated with one or both storage nodes NO and NOB.

Embodiments with Circuit Variations for a Write Operation

Figure 5:
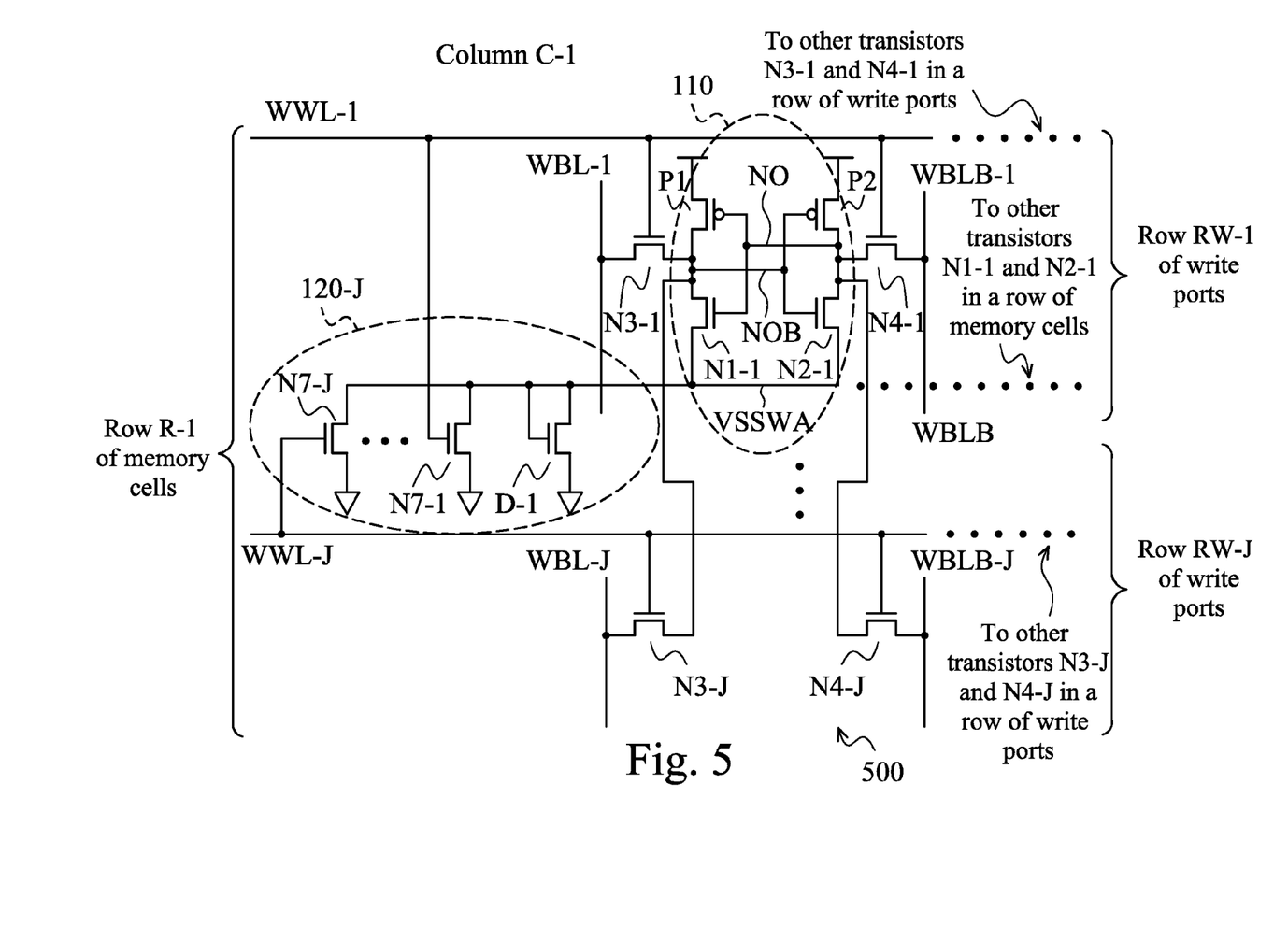
FIG. 5 is a diagram of a circuit illustrating the memory cell in FIG. 1 having J number of write ports, wherein J is a positive number, in accordance with some embodiments.

FIG. 5 is a diagram of a circuit 500 including J number of write ports associated with a memory cell 110 (e.g., memory cell 110-1-1, not shown) in a row and a column (e.g., row R-1 and column C-1) of the memory array, wherein J is a positive number, in accordance with some embodiments. For simplicity, memory cell 110-1-1 and circuitry associated with the read operation for memory cell 110-1-1 are not shown.

A circuit 120-J in FIG. 5 corresponds to a circuit 120 in FIG. 1. Circuit 120-J, however, includes J number of transistors N7 (e.g., transistors N7-1 to N7-J) having their gates coupled to J number of write word lines WWL (e.g., write word lines WWL-1 to WWL-J). For example, the gate of transistor N7-1 is coupled to write word line WWL-1, and the gate of transistor N7-J is coupled to write word line WWL-J, etc. Stated another way, a write word line WWL turns on/off a corresponding transistor N7 in circuit 120-J. When a write word line WWL (e.g., write word line WWL-1) turns on a corresponding transistor N7 (e.g., transistor N7-1), transistor N7-1 serves as a current path for node VSSWA. For example, the current through node VSSWA flows through transistor N7-1.

A write word line WWL is also associated with a pair of transistors N3 and N4, which in turn is associated with a pair of write bit lines WBL and WBLB. For example, write word line WWL-1 is coupled to the gates of transistors N3-1 and N4-1, and write word line WWL-J is coupled to the gates of transistors N3-J and N4-J, etc.

Each pair of transistors N3 and N4 is associated with a pair of respective write bit lines WBL and WBLB. For example, the sources of the pair of transistors N3-1 and N4-1 are coupled to the pair of respective write bit lines WBL-1 and WBLB-1, and the sources of the pair of transistors N3-J and N4-J are coupled to the pair of respective write bit lines WBL-J and WBLB-J, etc. The drains of transistors N3 of the J number of write ports associated with a memory cell 110 are coupled to a storage node of memory cell 110 while the drains of transistors N4 of the J number of write ports associated with the memory cell 110 are coupled to the other storage node. For example, transistors N3-1 to N3-J of J number or write ports associated with memory cell 110-1-1 are coupled to node NOB of memory cell 110-1-1 while transistors N4-1 to N4-J of J number of write ports associated with memory cell 110-1-1 are coupled to node NO of memory cell 110-1-1.

When a write port is selected for writing data to a memory cell 110, the corresponding write word line WWL, transistor N7, write bit line WBL, and pair of transistors N3 and N4 are activated. For example, when write word line WWL-J is activated, write word line WWL-J activates transistor N7-J of circuit 120-J. Node VSSWA coupling memory cells 110 in a same row (e.g., row R1) use transistor N7-J as a current path. Write word line WWL-J also turn on transistors N3-J and N4-J. In the mean time, the write data is placed at the respective write bit line WBL-J and WBLB-J, and is then transferred to nodes NOB and NB through the respective transistors N3-J and N4-J. In some embodiments, writing to a memory cell 110 in a multiple write port situation is similar to writing to a memory cell 110 in a single write port situation. For example, writing to a memory cell results in writing to a plurality of memory cells in a same row of the memory array.

In an un-accessed memory row (e.g., row R-2, not labeled), all write word lines WWL (e.g., write word lines WWL-2 to WWL-J) associated with row R-2 are inactivated, transistors N7-2 to N7-J associated with row R-2 are inactivated, diode D-2 (not labeled) associated with row R-2 is used as a current path for node VSSWA associated with row R-2, and node VSSWA associated with row R-2 is raised by voltage VtD, which reduces leakage current as explained above. In some embodiments, when a row (e.g., row R-1) is accessed, the other rows (e.g., row R-2 to R-n) are un-accessed.

A number of embodiments have been described. It will nevertheless be understood that various modifications may be made without departing from the spirit and scope of the various embodiments. For example, the various transistors being shown as a particular dopant type (e.g., NMOS and PMOS) are for illustration purposes, various embodiments are not limited to a particular type, but the dopant type selected for a particular transistor is a design choice and is within the scope of the various embodiments. The logic level (e.g., low or high) of the various signals used in the above description is also for illustration purposes, embodiments are not limited to a particular level when a signal is activated and/or deactivated, but, rather, selecting such a level is a matter of design choice. Various transistors and diodes (e.g., transistors N7, N8, diodes, D, etc.) function as switches. As a result, switches, switching circuits, devices, network, etc., may be used in place of transistors and/or diodes.

Some embodiments regard a method of controlling a plurality of memory cells in a row. The method includes controlling a switching element using at least one write word line signal to raise a voltage of a node connected to the plurality of memory cells in the row when the plurality of memory cells in the row operate in a first mode. The method further includes controlling at least one transistor using the at least one write word line signal to connect the plurality of memory cells in the row to a reference voltage when the plurality of memory cells in the row operate in a second mode.

Some embodiments regard a method of writing data to a memory cell in a memory array. The method includes electrically disconnecting at least one write bit line from a charging circuit if the memory cell is operating in a first mode. The method further includes placing data on the at least one write bit line. The method further includes activating at least one write word line corresponding to the memory cell. Activating the at least one write word line includes turning on at least one transistor to connect the memory cell to a reference voltage if the memory cell is operating in the first mode and controlling a switching element to raise a voltage of a node connected to the memory cell if the memory cell is operating in a second mode. The method further includes transferring the data on the at least one write bit line to nodes in the memory cell.

Some embodiments regard a method of reading data from a memory cell. The method includes electrically disconnecting at least one read bit line from a charging circuit. The method further includes activating at least one read word line connected to the memory cell. Activating the at least one read word line includes controlling at least one transistor of a read support circuit to electrically disconnect the at least one read bit line from a reference voltage if the memory cell is operating in a first state and controlling the at least one transistor of the read support circuit to electrically connect the at least one read bit line to a reference voltage if the memory cell is operating in a second state. The method further includes detecting a logic level of the at least one read bit line corresponding to data stored in the memory cell.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A method of controlling a plurality of memory cells in a row, the method comprising:
   controlling a switching element, responsive to at least one write word line signal, to set a node connected to the plurality of memory cells in the row at a raised voltage level when the plurality of memory cells in the row operate in a first mode; and
   controlling at least one transistor using the at least one write word line signal to set the node at a reference voltage level less than the raised voltage level when the plurality of memory cells in the row operate in a second mode, wherein a voltage difference between the raised voltage level and the reference voltage level is equal to a voltage drop across the switching element.

2. The method of claim 1, wherein controlling the switching element comprises controlling a diode, a p-type metal-oxide-semiconductor (PMOS) transistor, or an n-type metal-oxide-semiconductor (NMOS) transistor.

3. The method of claim 1, wherein controlling the at least one transistor comprises controlling an NMOS transistor.

4. The method of claim 1, wherein controlling the at least one transistor comprises controlling a PMOS transistor using an inverter.

5. The method of claim 1, wherein controlling the at least one transistor comprises controlling a plurality of transistors and a number of transistors in the plurality of transistors equals a number of write word lines.

6. The method of claim 5, wherein controlling the at least one transistor comprises independently controlling each transistor of the plurality of transistors using one of the number of write word lines.

7. A method of writing data to a memory cell in a memory array, the method comprising:
   electrically disconnecting at least one write bit line from a charging circuit if the memory cell is operating in a first mode;
   placing data on the at least one write bit line;
   activating at least one write word line corresponding to the memory cell, wherein activating the at least one write word line comprises:
      turning on at least one transistor to connect the memory cell to a reference voltage if the memory cell is operating in the first mode; and
      controlling a switching element to raise a voltage of a node connected to the memory cell if the memory cell is operating in a second mode; and
   transferring the data on the at least one write bit line to nodes in the memory cell.

8. The method of claim 7, wherein controlling the switching element comprises controlling a diode, a p-type metal-oxide-semiconductor (PMOS) transistor, or an n-type metal-oxide-semiconductor (NMOS) transistor.

9. The method of claim 7, wherein controlling the transistor comprises controlling an NMOS transistor.

10. The method of claim 7, wherein controlling the transistor comprises controlling a PMOS transistor using an inverter.

11. The method of claim 7, wherein controlling the switching element comprises raising the voltage of the node to a voltage level equal to a voltage drop across the switching element.

12. The method of claim 7, wherein turning on the at least one transistor comprises turning on one of a plurality of transistors and a number of transistors in the plurality of transistors equals a number of write word lines.

13. The method of claim 12, wherein controlling the at least one transistor comprises independently controlling each transistor of the plurality of transistors using one of the number of write word lines.

14. A method of reading data from a memory cell, the method comprising:
   electrically disconnecting at least one read bit line from a charging circuit;
   activating at least one read word line connected to the memory cell, wherein activating the at least one read word line comprises:
      controlling at least one transistor of a read support circuit to electrically disconnect the at least one read bit line from a reference voltage if the memory cell is operating in a first state; and controlling the at least one transistor of the read support circuit to electrically connect the at least one read bit line to the reference voltage if the memory cell is operating in a second state; and detecting a logic level of the at least one read bit line corresponding to data stored in the memory cell.

15. The method of claim 14, wherein electrically disconnecting the at least one read bit line from the reference voltage comprises floating a node at a drain of the transistor to reduce current leakage.

16. The method of claim 14, wherein controlling the transistor comprises:

turning the transistor on if the memory cell in operating in the first state; and turning the transistor off if the memory cell is operating in the second state.

17. The method of claim 14, further comprising:

providing a low logic level to the at least one read bit line when a node of the memory cell stores a high logic level.

18. The method of claim 14, wherein controlling the at least one transistor comprises controlling a plurality of transistors and a number of transistors in the plurality of transistors equals a number of read word lines.

19. The method of claim 18, wherein controlling the at least one transistor comprises independently controlling each transistor of the plurality of transistors using one of the number of read word lines.

* * * * *